United States Patent [19]

Pollard

[11] 4,445,269

[45] May 1, 1984

[54] METHODS OF MAKING INFRARED PHOTOCONDUCTORS WITH PASSIVATION CONTROL

[75] Inventor: John H. Pollard, Alexandria, Va.

[73] Assignee: The United States of America as represented by the Secretary of the Army, Washington, D.C.

[21] Appl. No.: 296,751

[22] Filed: Aug. 27, 1981

[51] Int. Cl.³ .................... H01L 21/368; H01L 21/28
[52] U.S. Cl. ........................ 29/572; 29/580; 148/171
[58] Field of Search ............... 29/572, 580; 357/30; 250/338; 148/171

[56] References Cited

U.S. PATENT DOCUMENTS

| | | | |
|---|---|---|---|
| Re. 30,412 | 10/1980 | Raychaudhuri | 29/572 X |
| 3,858,306 | 1/1975 | Kloek et al. | 29/572 |
| 3,962,778 | 6/1976 | Palmer | 29/572 |
| 4,037,311 | 7/1977 | Blackman et al. | 29/572 X |
| 4,228,365 | 10/1980 | Gutierrez et al. | 148/171 X |
| 4,273,596 | 6/1981 | Gutierrez et al. | 148/171 |
| 4,301,591 | 11/1981 | Withers | 29/572 |
| 4,321,615 | 3/1982 | Blackman et al. | 357/30 |
| 4,355,456 | 1/1982 | Harnagel et al. | 29/572 |

Primary Examiner—G. Ozaki
Attorney, Agent, or Firm—Milton W. Lee; Anthony T. Lane; Aubrey J. Dunn

[57] ABSTRACT

An array of semiconductive photoconductor detectors is formed on a substrate with which the array forms a heterojunction. The array has a whole or partial overlayer of the same material as the substrate. Ohmic connections are made on the detectors and conductive read-out leads are connected to these connections; the leads are made of a conductor that forms a Schottky barrier with the substrate and overlayer. Ohmic connections are made to the substrate and overlayer such that a voltage bias may be applied between the substrate-overlayer combination and the array. The bais is used to control the accumulation layer in the substrate beneath the array in order to maximize sesitivity.

2 Claims, 7 Drawing Figures $5 \times 10^{14}$ N  —  $1 \times 10^{14}$ N

BIAS  —  0.25 VOLTS

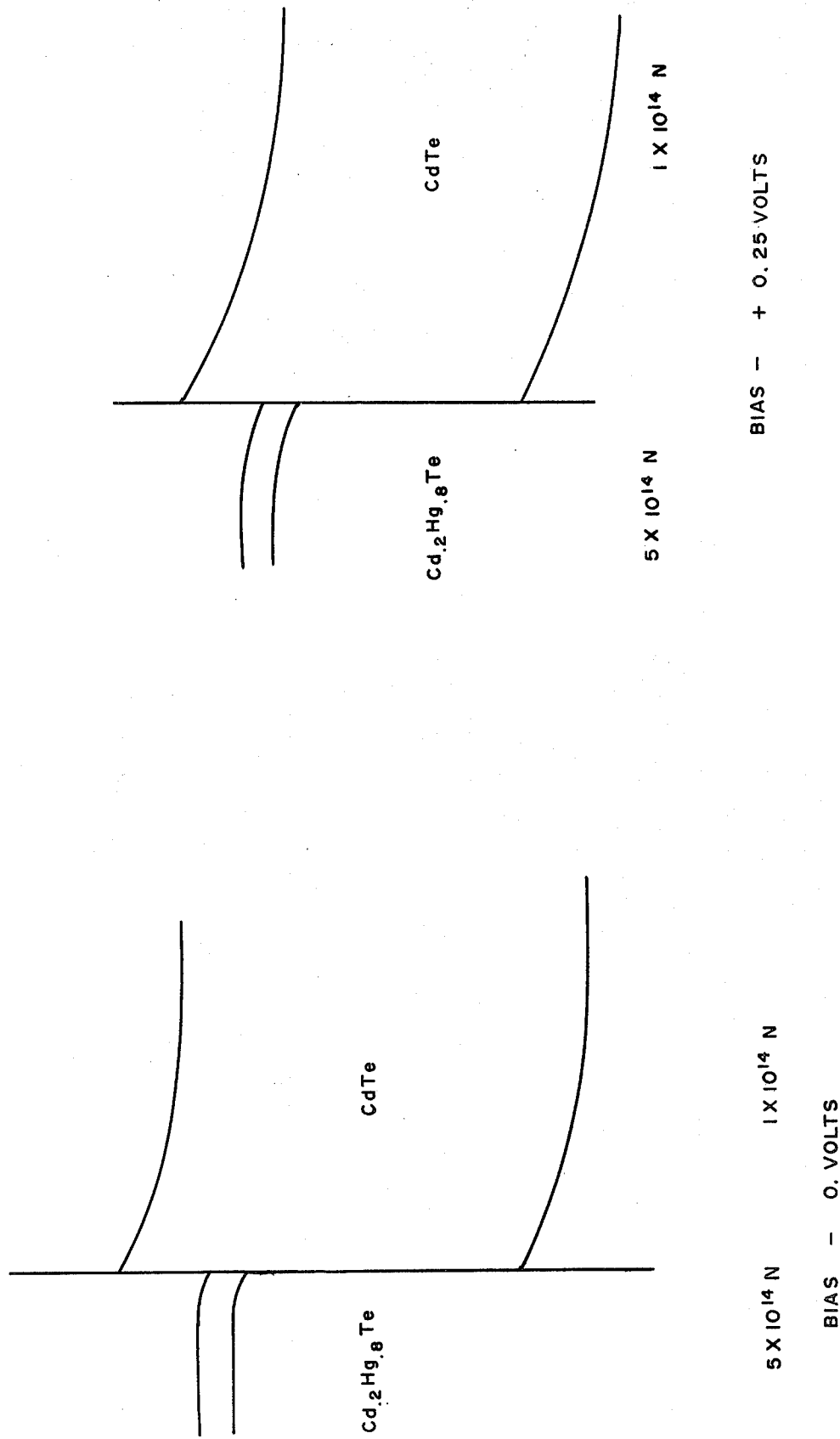

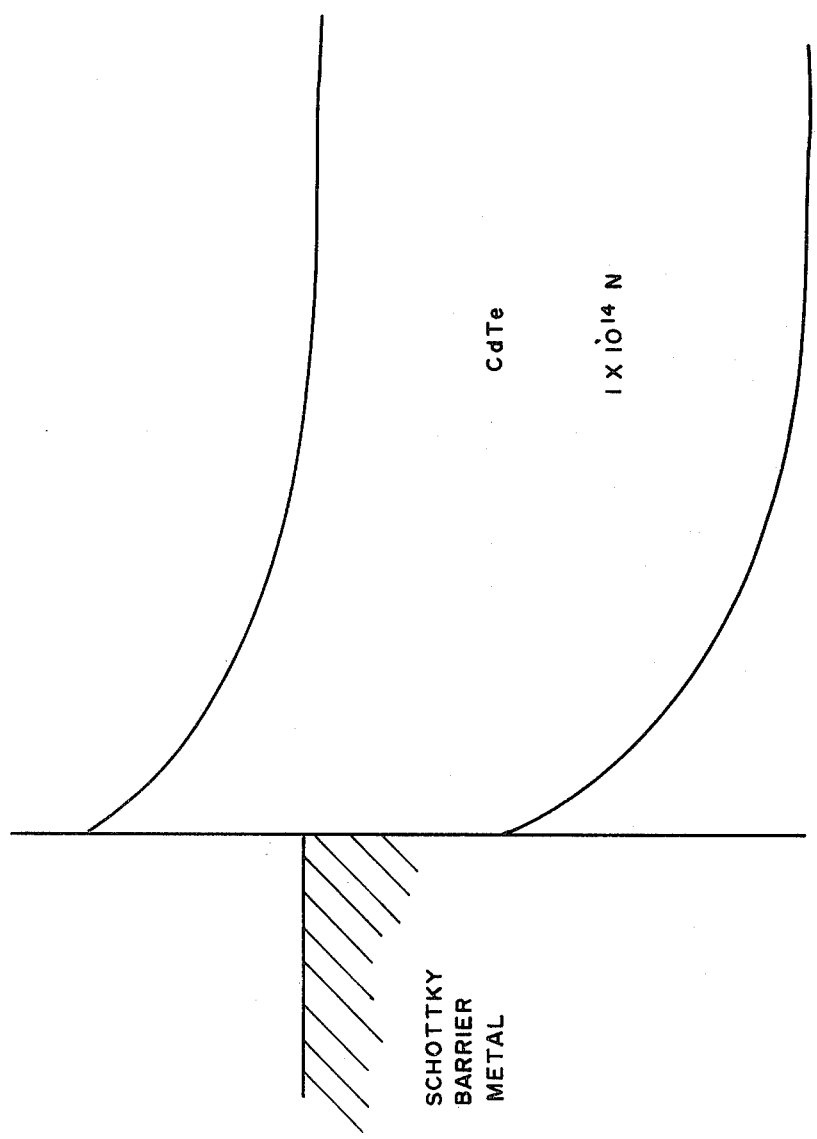

Page 1 …

METHODS OF MAKING INFRARED PHOTOCONDUCTORS WITH PASSIVATION CONTROL

The invention desribed herein may be manufactured, used and licensed by the U.S. Government for governmental purposes without the payment of any royalties thereon.

BACKGROUND OF THE INVENTION

This invention is in the field of infrared image detection, in particular, those detectors using a two-dimensional array of photoconductors. A typical such array consists of semiconductive layers (photoconductors) grown onto or adhesively bonded to an insulating chip and various interconnecting conductors to the layers. The methods by which currently known detectors are made include steps to establish passivation between the photoconductors and the chip. The known passivation methods leave the photoconductors with a slight charge accumulation at their interface with the chip. This charge accumulation may adversely (or beneficially) affect detector sensitivity but has the disadvantage that it cannot be controlled or corrected after the detector is made. The present invention is able to overcome this disadvantage.

SUMMARY OF THE INVENTION

The instant invention is an improved infrared imaging detector, and the method by which such a detector is produced. In particular, the detector consists of a semiconductor chip or substrate doped slightly conductive. On this chip is an array of photoconductors with their respective connecting conductors wholly or partially covered by a thin layer of the same material as the substrate. In use, a bias is applied between the thin layer and the substrate to control the charge accumulation between the photoconductors and the substrate and thus to optimize detector sensitivity. The detector may be made by either of two methods; one method includes the step of: growing a layer of photoconductor on a slightly conductive substrate, coating the photoconductor with a thin layer of substrate material, cutting away the coating and photoconductor to define individual detectors, and depositing ohmic contacts and connecting leads. The other method includes the steps of: forming islands of photoconductor on a slightly conductive substrate, coating the islands and the interspaces between the islands with the same material as the substrate, cutting through the coating to expose at least a part of each island, and forming conductive leads on the coating to the exposed island areas.

BRIEF DESCRIPTION OF THE DRAWINGS

FIGS. 4(a)-4(c) and 5 show junction profile graphs of the invention.

DESCRIPTION OF THE PREFERRED EMBODIMENTS

Figure 1:
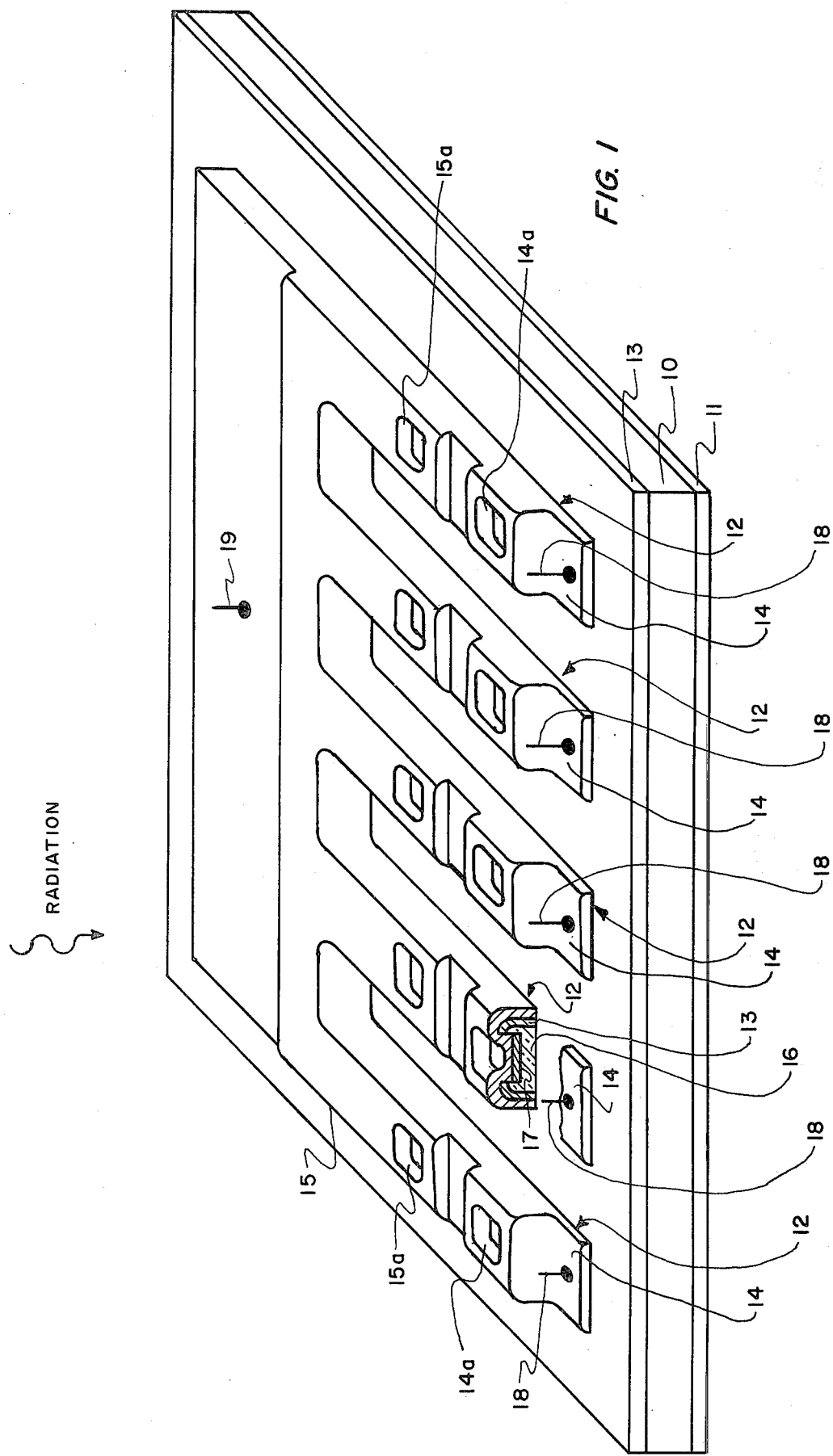
FIG. 1 shows a partially cut-away pictoral view of one embodiment of the invention apparatus.

The invention might be best understood by referring to the drawings, in which references numeral 10 of FIG. 1 designates a semiconductor substrate doped slightly conductive, and coated with ohmic contact layer 11. On substrate 10 is an array of photoconductive infrared detectors each generally designated 12. This array is formed in a comb shape, i.e. it consists of teeth 12 connected to a common back. Except for perforations made to allow ohmic connections, the array is covered by a thin layer 13 of the same semiconductor material as substrate 10. This layer has atop it conductive leads 14 for individual detectors 12 and a common lead 15. As can be seen in the cutaway portion of FIG. 1, each detector 12 includes a semiconductive bar 16 with two cavities formed therein. The bottom of each cavity is covered with an ohmic contact metal such as indium. Atop 16 is a continuation of previously mentioned layer 13 except for the area of the cavity in 16. On layer 13 is conductive lead 14 as previously mentioned. As can be seen, lead 14 forms a dimple 14a where it overlies the said cavity and covers contact 17. Connected to the end of 14 is metallic (gold) bonding lead 18, and to lead 15 is connected bonding lead 19. These bonding leads are used for read-out of the detectors. Although not shown in section, the region of each detector 12 under dimple 15a is constructed the same as the region under 14a, i.e. a cavity with an ohmic contact on the bottom and with lead 14 in contact with the ohmic contact. The various materials of the invention, i.e., 10, 11, 13, 14, 16, and 17 are chosen thusly: layer 11 and contact 17 are indium or some material that will form ohmic (low resistance) connections, respectively, with substrate 10 and bar 16; substrate 10 and layer 13 form heterojunctions with bar 16; leads 14 and 15 are Schottky barrier metals to layer 13 and to bar 16. It should be understood that each bar 16 extends under layer 13 and contact 15 such that all bars are connected in common. The actual detecting area of each detector 12 is that area of bar 16 underlying layer 13 and between leads 14 and 15. Infrared radiation coming from the direction as indicated by the radiation arrow of the drawing will penetrate layer 13 overlying bar 16 and will cause a change in conductivity in 16.

METHOD OF MAKING FIGURE 1 EMBODIMENT

The Figure 1 embodiment may be made with the following major steps:

(a) prepare substrate 10 by cleaning or the like, and coat with ohmic contact layer 11;

(b) deposit a layer of semiconductor photoconductor material on the opposite side of substrate 10 from layer 11;

(c) mask the photoconductor layer for the detector array;

(d) remove through the mask (as by ion million or etching) portions of the photoconductive layer down to substrate 10, to form bars 16;

(e) remove mask;

(f) deposit layer 13 of same material as substrate to cover detector array and bare areas of substrate (vapor-phase growth, for example);

(g) mask for detector ohmic contacts;

(h) ion mill or the like through layer 13 and into bars 16;

(i) deposit (as by evaporation) ohmic contact material (17) into the cavities;

(j) remove mask and contact material atop it;

(k) coat (as by evaporation) layer 13 with a metal layer which forms a Schottky barrier with layer 13 and which will serve as contacts 14 and 15;
(l) mask metal layer;
(m) ion mill to form contacts 14 and 15;
(n) remove mask;
(o) bond leads 18 and 19.

Obviously, variations within the scope of the invention are possible in the sequence of steps and some steps may actually include a sequence of steps. For example, substrate 10 may be coated with layer 11 after the other steps are done; the steps of masking may include the steps of: coating with a photosensitive layer, exposing the layer through a pattern to radiation, and developing the layer thus exposed.

Figure 2:
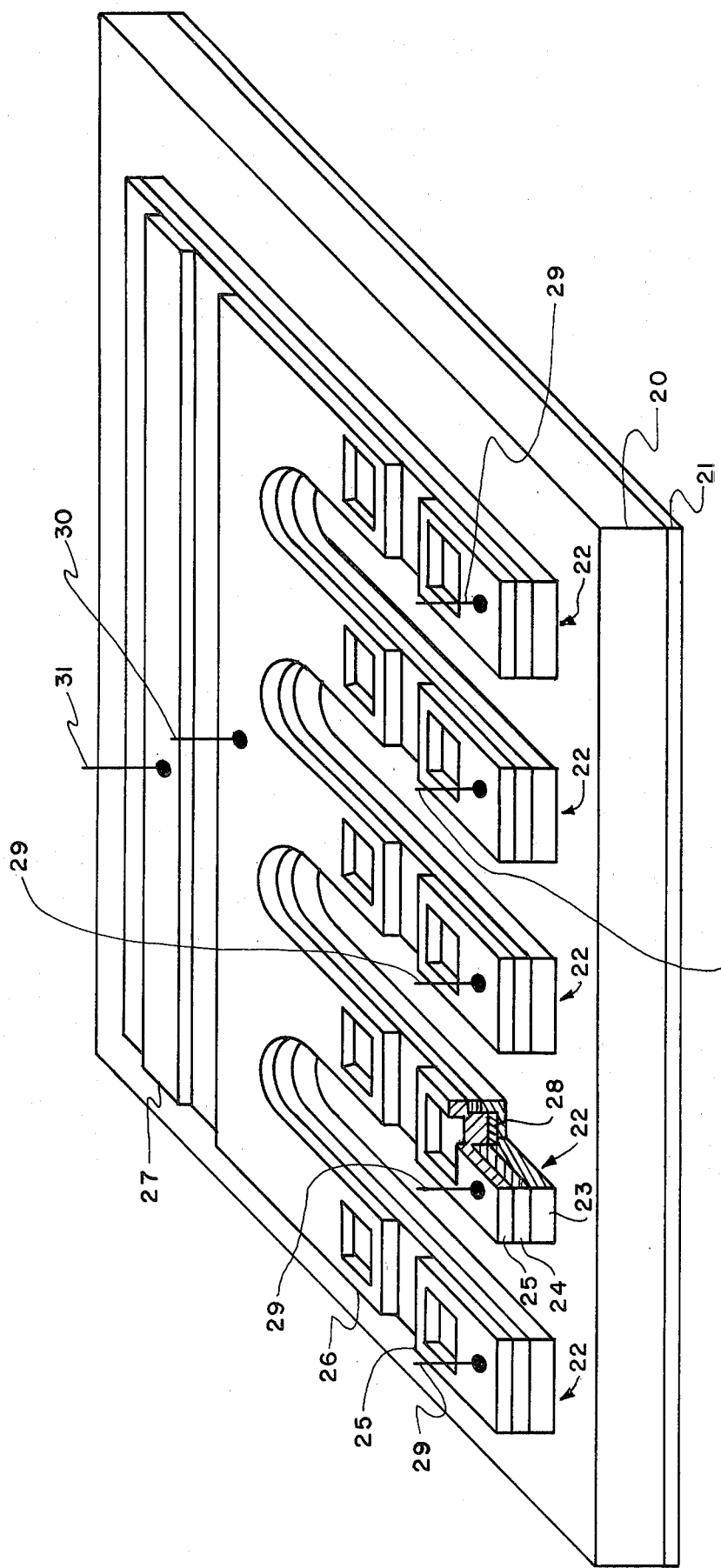
FIG. 2 shows a partially cut-away pictoral view of another embodiment of the invention apparatus.

The embodiment of FIG. 2 is somewhat similar to the FIG. 1 embodiment but is made by a different process, to be set forth below. Reference numeral 20 of FIG. 2 designates a substrate the same as FIG. 1, with ohmic contact layer 21 thereon. On the other side of 20 is a detector array including individual detectors each generally designated 22. The array is made up of various layers, including photoconductive layer 23 and overlayer 24. Layer 24 is of the same material as substrate 20 and corresponds to layer 13 of FIG. 1. Atop overlayer 24 are electrical contacts 25, 26, and 27. Contacts 25 and 26 are the read-out leads for detectors 22 and are of a metal that form a Schottky barrier with layer 24. As can be seen in the cutaway portion of the figure, layer 23 has a cavity therein, with a metal layer 28 (indium) on the bottom of the cavity. Layer 24 has a perforation therethrough, and contact 25 extends down through this perforation and contacts layer 28. Bonding leads 29, 30, and 31 are connected as shown. Contact 27 is of indium and forms an ohmic contact to layer 24.

METHOD OF MAKING FIGURE 2 EMBODIMENT

The FIG. 2 embodiment may be made with the following major steps:
(a) prepare substrate 20 and coat with ohmic contact layer 21;
(b) deposit layer 23 of semiconductor photoconductor material on the opposite side of the substrate from layer 21;
(c) deposit atop layer 23 the layer 24 of same material as substrate;
(d) mask for detector ohmic contacts;
(e) ion mill through layer 24 and into layer 23;
(f) deposit ohmic contact material;
(g) strip mask and ohmic contact thereon;
(h) deposit Schottky barrier metal for contacts 25 and 26;
(i) mask for detector delineation;
(j) ion mill detectors 22 as shown;
(k) remove mask;
(l) mask for detector active areas (those areas between contacts 25 and 26);
(m) ion mill for detector areas;
(n) strip mask;
(o) mask for contact 27 and deposit same;
(p) strip mask;
(q) attach bonding leads 29, 30, and 31.

Figure 3:
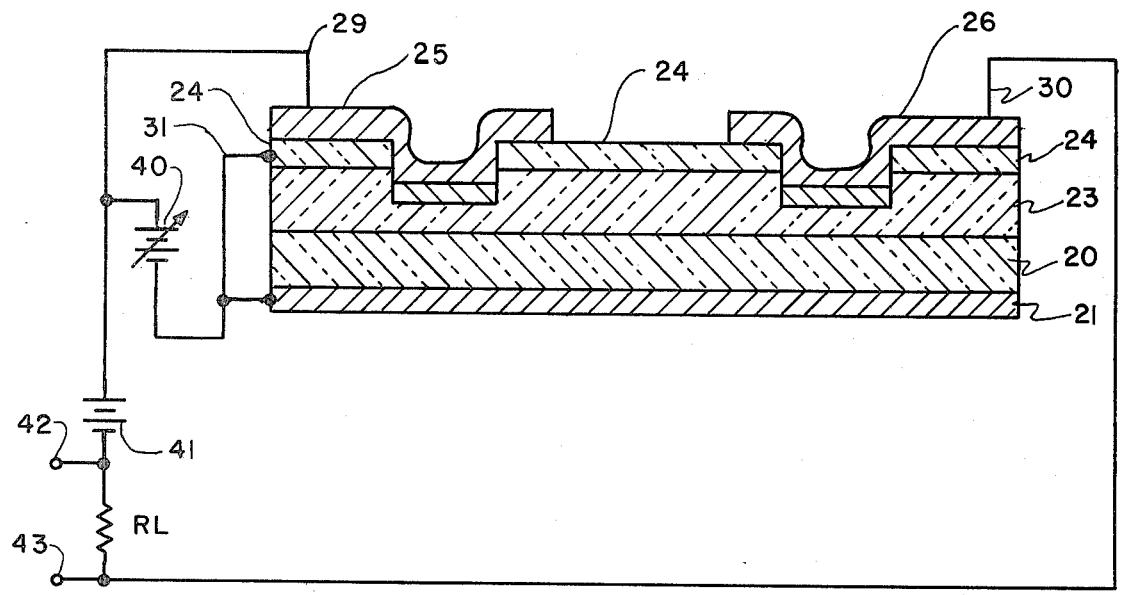
FIG. 3 shows a sectional view of one embodiment of the invention with a schematic portion added.

FIG. 3 shows how electrical biases are applied to the various layers of FIG. 2. Battery 40 is connected to layers 21, 24, and 25 as shown and provides an adjustable bias between the detector and substrate/overlayer (20, 24/23). This bias is used to control the accumulation between the detector and the substrate. Battery 41 is the read-out battery for the detector and provides a current through that portion of layer 24 between bonding leads 29 and 30. Radiation passing through layer 24 and falling on layer 23 will cause a change in this current. Such change will cause a corresponding change in voltage between contacts 42 and 43 of load resistor $R_L$; the voltage across $R_L$ is thus the output voltage for the detector. It should be understood that there will be an individual $R_L$ for each detector, although all detectors may be biased from a common battery.

Figure 4A:
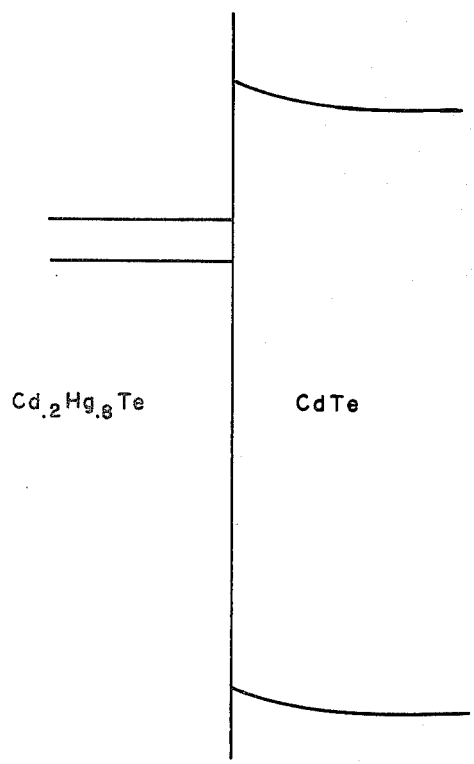

FIGS. 4(a)–4(c) show junction profiles for a particular CdHgTe-CdTe junction. It is generally believed, by those skilled in the art, that for an n-type photoconductor, the optimum responsivity is obtained with the CdHgTe slightly accumulated at the junction. In accordance with the present invention, a heterojunction is established by control of doping levels. A bias voltage is then applied between the CdHgTe and the CdTe to control the accumulation at the junction. FIG. 4(a) shows the result of a −0.25 volt bias voltage; as can be seen, an approximately flat band condition exists. For zero bias voltage as in FIG. 4(b), slight accumulation exists. If a bias of +0.25 volts is applied, as shown in FIG. 4(c), the junction becomes fully accumulated. The detector response is optimized by controlling the bias and continuously monitoring the results thereof. Obviously, the bias voltage is applied after the detector is fabricated and response is optimized at this time whereas prior art detectors cannot be optimized once they are fabricated. It should be understood that although particular doping types and concentrations are shown on the drawing, similar considerations apply for opposite type doping and different concentrations. In practice, the polarity and amplitude of the bias voltage is adjusted as needed to optimize detector response.

FIG. 5 shows the junction profile between a Schottky barrier metal and CdTe of a particular doping. As can be seen, the junction acts as an insulator, i.e., electron injection into the metal does not occur for the bias voltages that will be used.

In each of FIGS. 4(a)–4(c) and FIG. 5, it should be understood that the abscissa and ordinate of each profile are respectively: distance across the junction and voltage. As usual in this type of profile, the upper and lower curves are respectively for conduction and valence bands. The doping levels as shown on the drawings are carrier concentrations per cubic centimeter. The intended range of these concentrations for a slightly conductive semiconductor is from $10^{13}$ to $10^{15}$ carriers per $cm^3$, and the dopings may form n-n or p-p junctions. The primary requirements for the inventive devices are as follows: a photoconductor with a predetermined bandgap and; a substrate lattice matched with the photoconductor, but with a wider bandgap, and with a suitable difference in electron afinity. The examples given above meet these requirements.

The materials (metals) from which the Schottky barrier contact are chosen include: Al, Au, Pt, Mn, Ag, and Cr. The particular method whereby the detectors are formed is not critical to this invention. Various such methods are known in the art, such as those shown in U.S. Pat. Nos. 4,228,365 of Oct. 14, 1980, and 4,273,596 of June 16, 1981. In both of these patents, the instant inventor was a joint inventor.

I claim:

1. A method of making an infrared detector from a semiconductor substrate doped slightly conductive, which method includes the following steps:
   (a) prepare the substrate and coat one side thereof with an ohmic contact metal;
   (b) deposit a layer of semiconductor photoconductor material on the opposite side of said substrate from said metal;
   (c) mask the photoconductor layer;
   (d) remove the unmasked portion of the photoconductor layer;
   (e) remove the mask;
   (f) deposit an overlayer of the same material as the substrate atop the bared substrate and the remaining photoconductive layer;
   (g) mask the overlayer for detector ohmic contacts;
   (h) remove the unmasked portions of the overlayer and a portion of the photoconductor layer to form cavities therein;
   (i) deposit ohmic contact material atop the mask and onto the bottoms of said cavities;
   (j) remove the mask and the contact material thereon;
   (k) coat the overlayer and the surfaces of the cavities with a Schottky barrier metal;
   (l) mask the metal;
   (m) remove the unmasked portions of the metal whereby read contacts remain atop the overlayer and connect to the ohmic contacts in said cavities;
   (n) remove the mask; and
   (o) apply bonding leads to the read contacts.

2. A method of making an infrared detector from a semiconductor substrate doped slightly conductive, which method includes the following steps:
   (a) prepare the substrate and coat one side with an ohmic contact metal;
   (b) deposit a layer of semiconductor photoconductor material on the opposite side of said substrate from metal;
   (c) deposit atop said material an overlayer of the same material as the substrate;
   (d) mask the overlayer for detector ohmic contacts;
   (e) remove the unmasked portions of the overlayer and a portion of the photoconductor layer to form cavities therein;
   (f) deposit ohmic contact material atop the mask and onto the bottom of said cavities
   (g) remove the mask and the contact material thereon;
   (h) deposit a layer of Schottky barrier metal atop the overlayer and onto the walls and bottoms of said cavities;
   (i) mask for detector delineation;
   (j) remove the unmasked portions of the Schottky barrier metal and the overlayer therebeneath;
   (k) remove mask;
   (l) mask the remaining Schottky barrier metal for detector active areas;
   (m) remove the unmasked Schottky barrier metal;
   (n) remove mask;
   (o) mask for ohmic contact to overlayer and deposit ohmic contact;
   (p) strip mask; and
   (q) attach bonding leads to overlayer ohmic contact and to detector ohmic contacts.

* * * * *